United States Patent
Chan et al.

(10) Patent No.: US 9,663,854 B2
(45) Date of Patent: May 30, 2017

(54) HIGH-THROUGHPUT SYSTEM AND METHOD FOR POST-IMPLANTATION SINGLE WAFER WARM-UP

(71) Applicant: Taiwan Semiconductor Manufacturing Company, Ltd., Hsin-Chu (TW)

(72) Inventors: Tsun-Jen Chan, Taoyuan County (TW); Cheng-Hung Hu, Hsinchu (TW); Yi-Hann Chen, Hsinchu (TW); Kang Hua Chang, Hsinchu (TW); Ming-Te Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/205,299

(22) Filed: Mar. 11, 2014

(65) Prior Publication Data

US 2014/0273421 A1 Sep. 18, 2014

Related U.S. Application Data

(60) Provisional application No. 61/785,729, filed on Mar. 14, 2013.

(51) Int. Cl.
*H01L 21/265* (2006.01)
*C23C 14/54* (2006.01)
(Continued)

(52) U.S. Cl.
CPC .......... *C23C 14/54* (2013.01); *H01J 37/3171* (2013.01); *H01L 21/265* (2013.01);
(Continued)

(58) Field of Classification Search
CPC .......... H01L 21/26513; H01L 21/26593; H01L 21/265; H01L 21/324; H01L 21/67213;
(Continued)

(56) References Cited

U.S. PATENT DOCUMENTS 7,059,817 B2 * 6/2006 Sieradzki .......... H01L 21/67778
414/217
7,935,942 B2 * 5/2011 England ............ H01L 21/26593
118/723 CB
(Continued)

FOREIGN PATENT DOCUMENTS

TW 200809930 A 2/2008

*Primary Examiner* — Michael Trinh
(74) *Attorney, Agent, or Firm* — Haynes and Boone, LLP

(57) ABSTRACT

A high throughput system for warming a wafer to a desired temperature after undergoing a low-temperature implantation process includes an implantation chamber, a wafer warming chamber configured to uniformly warm a single wafer, and a plurality of robotic arms to transfer wafers throughout the system. At each stage in the fabrication process, the robotic arms simultaneously work with multiple wafers and, therefore, the system provides a high throughput process. Also, the warming chamber may be a vacuum environment, thus eliminating the mist-condensation problem that results in wafer spotting.

23 Claims, 4 Drawing Sheets

(51) Int. Cl.
*H01J 37/317* (2006.01)
*H01L 21/67* (2006.01)
*H01L 21/677* (2006.01)

(52) U.S. Cl.
CPC .. *H01L 21/26593* (2013.01); *H01L 21/67115* (2013.01); *H01L 21/67201* (2013.01); *H01L 21/67213* (2013.01); *H01L 21/67745* (2013.01); *H01J 2237/31701* (2013.01)

(58) Field of Classification Search
CPC ......... H01L 21/67745; H01L 21/67201; H01L 21/67098; H01L 21/67115; Y10S 414/139; Y10S 414/137; Y10S 414/135; Y10S 414/136; H01J 37/3171; H01J 2237/2001; H01J 2237/31701
USPC .............................. 438/530, 514; 250/492.21
See application file for complete search history.

(56) References Cited

U.S. PATENT DOCUMENTS

| | | | |
|---|---|---|---|
| 8,450,193 B2 | 5/2013 | England et al. | |
| 2002/0068422 A1* | 6/2002 | Dairiki | H01L 21/2686 438/530 |
| 2006/0182532 A1* | 8/2006 | Okada | H01L 21/67201 414/217 |
| 2008/0044257 A1* | 2/2008 | England | H01L 21/67069 414/217.1 |
| 2010/0181500 A1* | 7/2010 | Chang | C30B 31/22 250/492.21 |
| 2010/0301236 A1* | 12/2010 | Shieh | H01J 37/3171 250/492.21 |

* cited by examiner

| Time Line | T1 | T2 | T3 | T4 | T5 | T6 | T7 | T8 | T9 | T10 | T11 | |
|---|---|---|---|---|---|---|---|---|---|---|---|---|
| Wafer 01 | Wafer was transferred to implant stage | Wafer low-temp. Implantation | Wafer was transferred to post-Imp warming stage | Wafer was warmed up | Wafer was transferred back to Load Lock | | | | | | | …… |
| Wafer 02 | …… | | Wafer was transferred to implant stage | Wafer low-temp. Implantation | Wafer was transferred to post-imp warming stage | Wafer was warmed up | Wafer was transferred back to Load Lock | | | | | |
| Wafer 03 | | | …… | | Wafer was transferred to implant stage | Wafer low-temp. Implantation | Wafer was transferred to post-imp warming stage | Wafer was warmed up | Wafer was transferred back to Load Lock | | | |
| Wafer 04 | | | | | | | Wafer was transferred to implant stage | Wafer low-temp. Implantation | Wafer was transferred to post-imp warming stage | Wafer was warmed up | Wafer was transferred back to Load Lock | |

FIG. 4

HIGH-THROUGHPUT SYSTEM AND METHOD FOR POST-IMPLANTATION SINGLE WAFER WARM-UP

PRIORITY DATA

This application claims priority to U.S. Provisional Patent Application No. 61/785,729, filed Mar. 15, 2013, entitled "HIGH-THROUGHPUT SYSTEM AND METHOD FOR POST-IMPLANTATION SINGLE WAFER WARM-UP," naming Tsun-Jen Chan et al as inventors, the disclosure of which is incorporated herein by reference in its entirety.

BACKGROUND

In conventional semiconductor fabrication processes, there are number of techniques for warming the wafers back to room temperature after low temperature implantation is complete. In one such technique, the wafer is warmed directly by the platen. In another, room temperature air is injected into the load lock and used to warm the wafers slowly. Lastly, a single tube-type lamp may be positioned inside the load lock to warm the wafers.

However, all these conventional techniques have disadvantages. Heating the platen directly results in low wafer per hour ("WPH") and reduces the throughput as it takes more time of the processing chamber. Injecting room temperature air into the load lock also results in low WPH and wafer spotting defects due to water condensation resulting from mist, in addition to absorbing a lot of time and negatively affecting throughput. Those techniques utilizing a single lamp to warm the wafers results in non-uniform heating, which further causes non-uniform dopant diffusion and non-uniform device behavior from wafer to wafer and from die to die.

Accordingly, there is a need in the art for a wafer warming technique which alleviates or eliminates these disadvantages.

BRIEF DESCRIPTION OF THE DRAWINGS

The present disclosure is best understood from the following detailed description when read in conjunction with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 illustrates a high throughput time sequence according to certain exemplary methodologies of the present invention.

DETAILED DESCRIPTION

Illustrative embodiments and related methodologies of the present invention are described below as they might be employed in a high throughput system and method for warming a semiconductor wafer after low temperature implantation has occurred. In the interest of clarity, not all features of an actual implementation or methodology are described in this specification. It will of course be appreciated that in the development of any such actual embodiment, numerous implementation specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the invention will become apparent from consideration of the following description and drawings.

As described herein, the present invention is directed to a time-efficient, high throughput system and method for warming a wafer to a desired temperature after undergoing a low temperature implantation process. In general, an exemplary system includes an implantation chamber, a wafer warming chamber configured to uniformly warm a single wafer, and a plurality of robotic arms to transfer wafers throughout the system. During an exemplary methodology, a first wafer undergoes a low temperature ion-implementation process and is transferred to the warming implementation chamber by one of the robotic arms. While the first wafer is being transferred to the warming chamber, a second wafer is transferred to the implementation chamber using a second robotic arm. As the first wafer is being warmed to substantially room temperature in the warming chamber, the second wafer undergoes implantation. The first wafer may then be transferred out of the warming chamber while the second wafer is transferred into the warming chamber. This process may occur for any number of wafers. Thus, at each stage in the fabrication process, the system (via the robotic arms) can simultaneously work with multiple wafers and, therefore, provide a high throughput process. In addition, the warming chamber may be a vacuum environment, thus eliminating the mist-condensation problem that results in wafer spotting. Accordingly, the wafer uniformity is increased, while also alleviating those issues related to wafer spotting and non-uniform heating associated with prior art methodologies.

Figure 1:
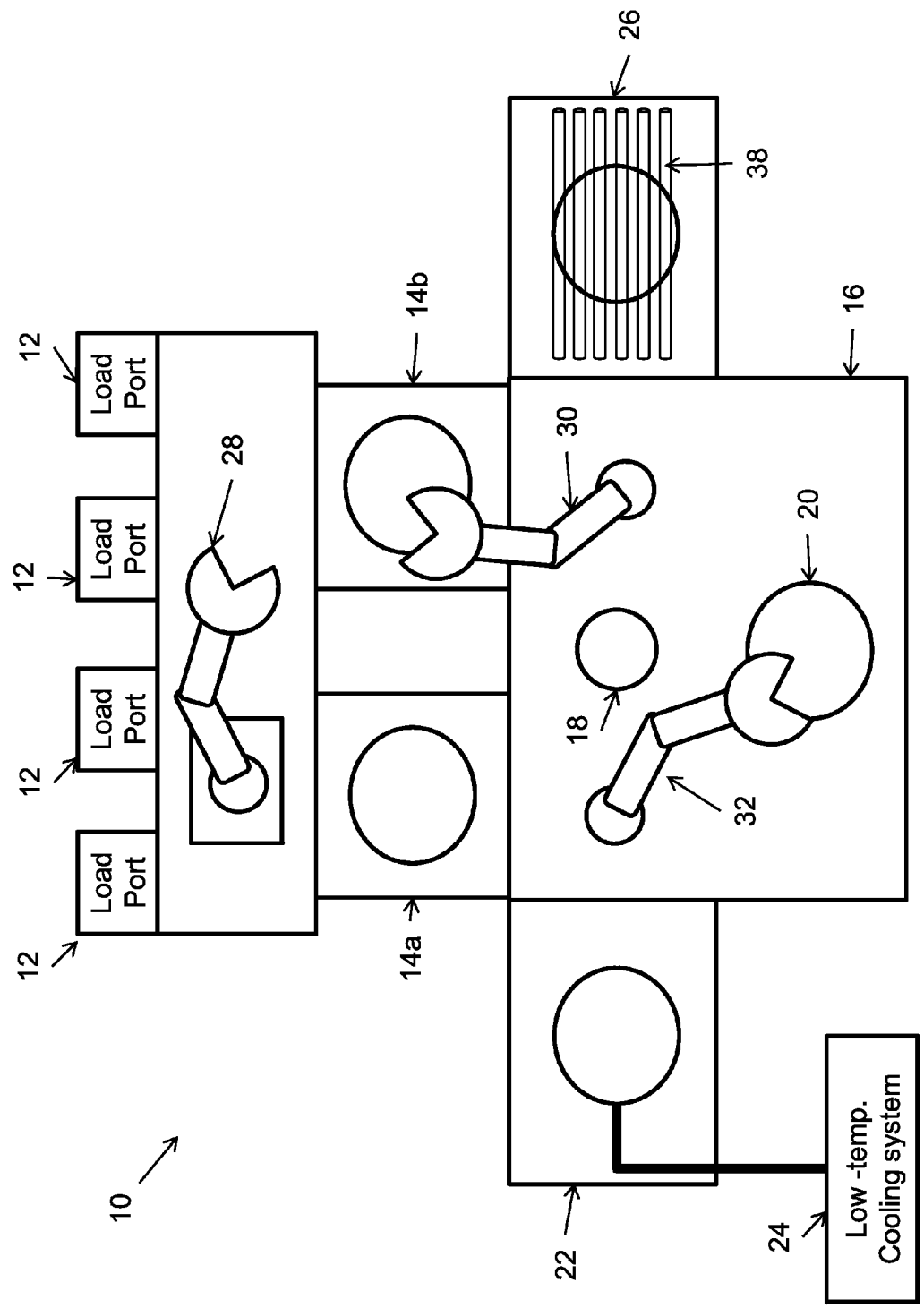
FIG. 1 is a top-side view of a semiconductor wafer fabrication system according to certain exemplary embodiments of the present invention.

FIG. 1 is a top-side view of a semiconductor wafer fabrication system 10 according to certain exemplary embodiments of the present invention. Wafer fabrication system 10 comprises a plurality of load ports 12 positioned adjacent a first and second load lock 14a,14b. As understood in the art, load locks 14a,14b are configured to hold a plurality of wafers during fabrication. Load locks 14a,14b are positioned adjacent an implantation chamber 16, which includes a wafer orientor 18 and platen 20. Implantation chamber 16 may be configured to perform a variety of implantation techniques, such as, for example, low temperature ion-implantation or room temperature implantation.

In this example, a pre-implantation cooling chamber 22 is positioned adjacent implantation chamber 16 to cool the wafers prior to implantation. In one exemplary embodiment, pre-implantation cooling chamber 22 may cool the wafers to −100 C., for example, in order to form the amorphous layer for ultra-shallow junctions, RC and leakage reduction, etc., as will be understood by those ordinarily skilled in the art having the benefit of this disclosure. A low temperature cooling system 24 is communicably coupled to pre-implantation cooling chamber 22 for controlling and providing the cooling environment present within pre-implantation cooling chamber 22. Although not shown, low temperature cooling system 24 includes at least one processor and associated circuitry to achieve its functionality.

Still referring to the exemplary embodiment of FIG. 1, wafer fabrication system 10 further includes a single wafer warming chamber 26 positioned adjacent to implantation chamber 16. In an alternative embodiment, however, single wafer warming chamber 26 may also be positioned inside implantation chamber 16 as an implantation stage chamber. As described herein, single wafer warming chamber 26 comprises one or more heating elements configured to uniformly heat the wafers. In addition, a robotic arm 28 is positioned adjacent load ports 12 for transferring wafers between load ports 12 and load locks 14a,14b. Robotic arms 30,32 are positioned inside implantation chamber 16 for simultaneously transferring wafers between load locks 14a, 14b, implantation chamber 16, pre-implantation cooling chamber 22, and single wafer warming chamber 26. Although three robotic arms are illustrated, those ordinarily skilled in the art having the benefit of this disclosure realize more or less arms may also be utilized as desired.

Although not illustrated, exemplary embodiments of wafer fabrication system 10 may include at least one processor, non-transitory computer-readable storage, communication module, I/O devices, an optional display, etc., all interconnected via a system bus. Software instructions executable by the processor for implementing the methodologies described herein may be stored in the system storage or some other computer-readable medium, or uploaded into such memories from another storage media via wired/wireless methodologies. In addition, wafer fabrication system 10 may be connected to one or more public and/or private networks via appropriate network connections.

Moreover, those ordinarily skilled in the art will appreciate that the invention may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof in a computer system or other processing system.

Figure 2:
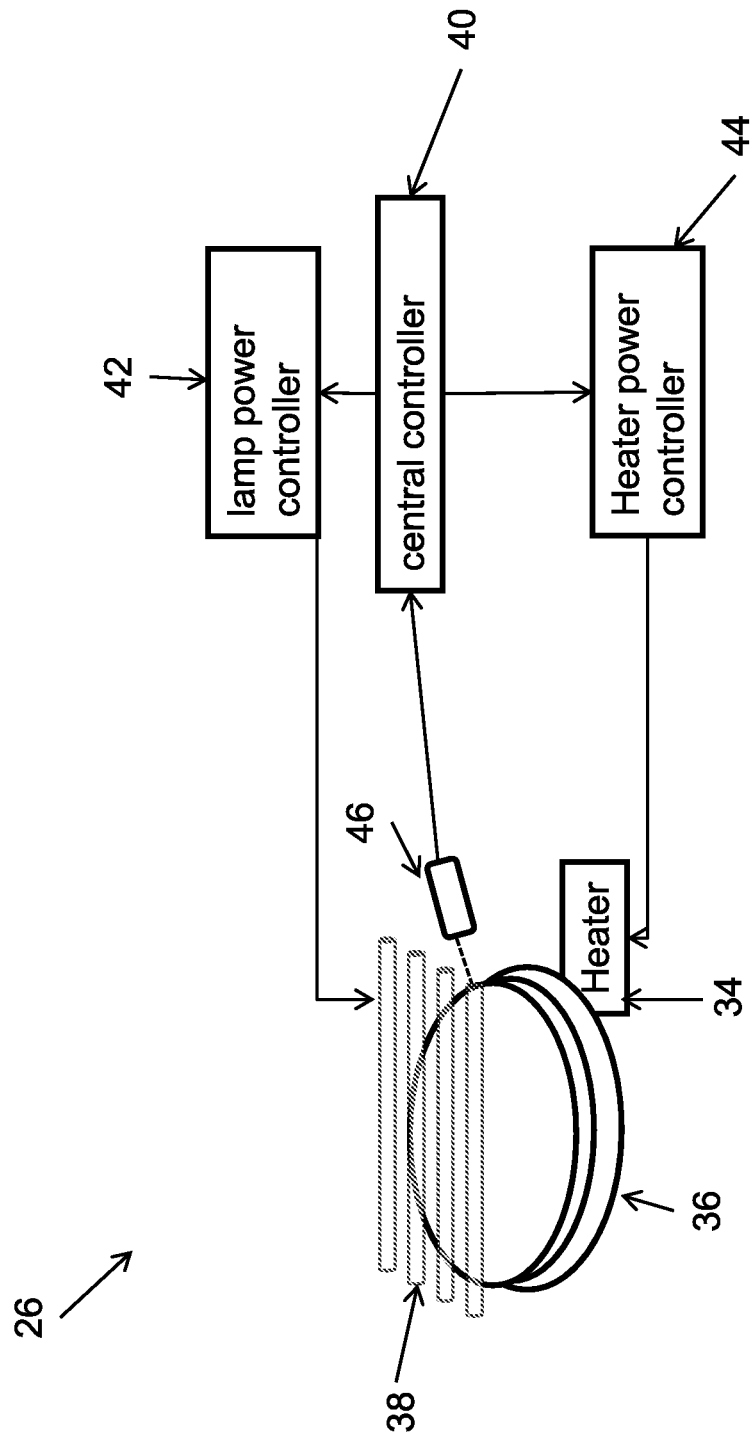
FIG. 2 illustrates a block diagrammatical view of single wafer warming chamber, according to certain exemplary embodiments of the present invention.

FIG. 2 illustrates a block diagrammatical view of single wafer warming chamber 26, according to certain exemplary embodiments of the present invention. For simplicity of understanding, not each feature of the chamber is illustrated here. However, those ordinarily skilled in the art having the benefit of this disclosure will readily understand how the described warming chamber may be fabricated and altered as desired. In one example, a thermal mechanism similar to a rapid thermal annealing ("RTA") tool may be used in the system. However, in the present embodiment, the warming chamber 26 is incorporated in the semiconductor wafer fabrication system 10. Nevertheless, in one exemplary embodiment, single wafer warming chamber 26 comprises a base 36 on which the wafers are positioned. Base 36 comprises a first heating element 34 configured to warm the lower surface of the wafers to a desired temperature. In the present example, such desired temperature is room temperature or substantially room temperature.

A second heating element 38 is positioned above base 36 in order to warm the upper surface of the wafers. Thus, first and second heating elements 34,38 work in combination to uniformly heat the wafers to the desired temperature. The heating duration depends on the heating power and the initial temperature of the wafer. In one example, the heating duration may take a few seconds to a few minutes. The heating elements may be a variety of elements, such as, for example, lamp-type heaters or conventional heating elements. In one example, halogen lamps may be used as heating elements. Moreover, in certain embodiments, single wafer warming chamber may be a vacuum chamber. In such embodiments, utilizing lamp type heaters will provide for greater heating efficiency that will also eliminate mist-condensation issues.

Certain exemplary embodiments of single wafer warming chamber 26 may also comprise a temperature control loop. Thus, as illustrated in FIG. 2, an exemplary control loop comprises a close-loop central controller 40 that is communicably coupled to a lamp power controller 42 and a heater power controller 44. A sensor 46 (pyro sensor, for example) is communicably coupled to central controller 40 and serves as the input to detect and transmit the temperature of the wafer to central controller 40. Thereafter, central controller 40 transmits the necessary control signals to lamp power controller 42 and heater power controller 44 to alter or maintain the temperature of the wafer as desired.

Figure 3:
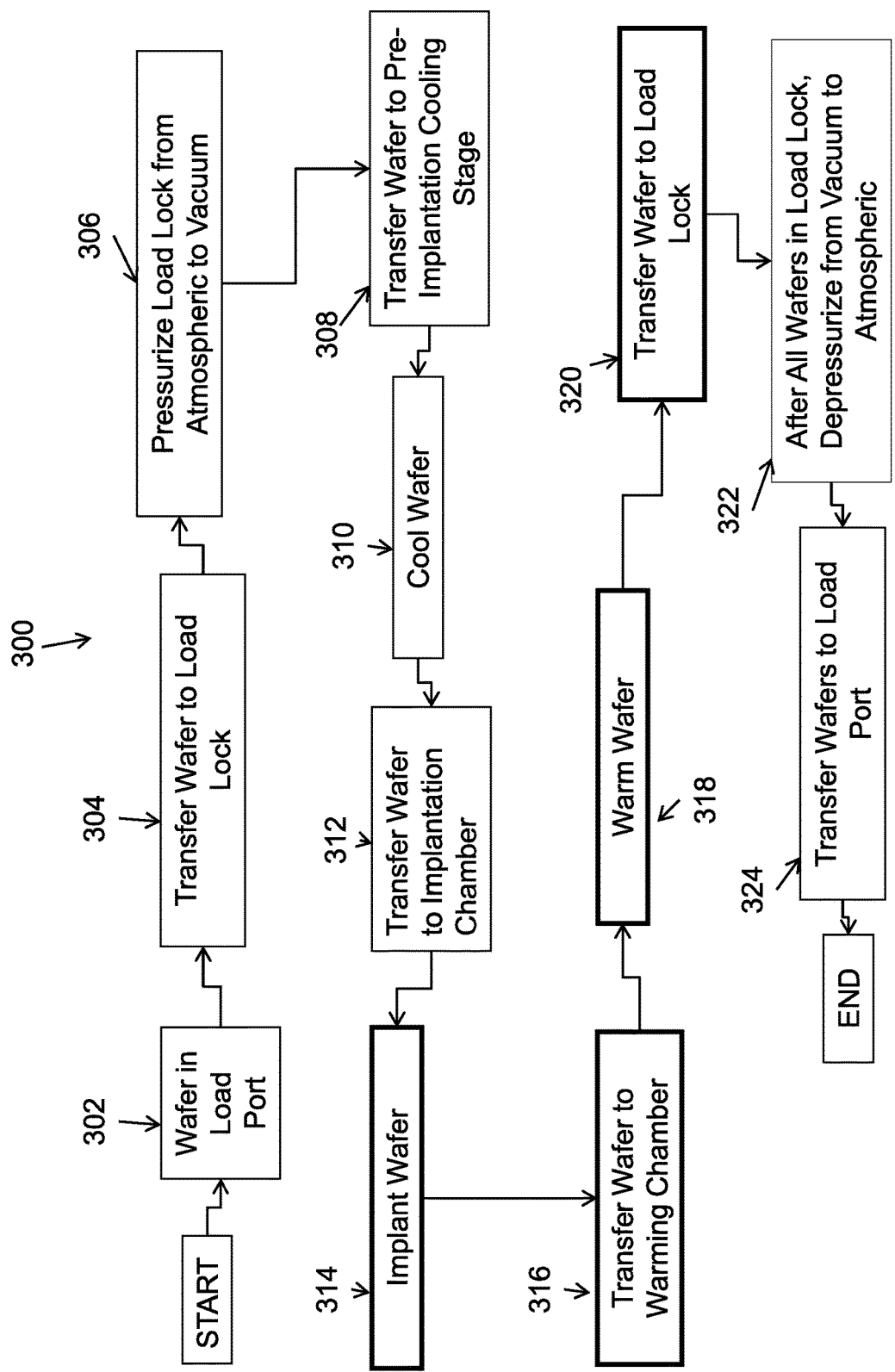
FIG. 3 is a flow chart of a high-throughput semiconductor fabrication process utilizing a post-implantation warming stage, according to certain exemplary methodologies of the present invention.

Now, with reference to FIGS. 1 and 3, an exemplary methodology 300 of the present invention will now be described. As described herein, method 300 is a high-throughput semiconductor fabrication process utilizing a post-implantation warming stage. At block 302, a plurality of wafers are loaded into load ports 12, and transferred to load lock 14a by robotic arm 28 at block 304. After the desired number of wafers is loaded into load lock 14a, wafer fabrication system 10 increases the pressure inside load lock 14a from atmospheric to vacuum. At block 308, wafer fabrication system 10 then transfers a single first wafer from load lock 14a to pre-implantation cooling chamber 22 using robotic arm 32. At block 310, wafer fabrication system 10 then cools down the first wafer using cooling system 24. At block 312, robotic arm 32 then transfers the cooled first wafer to platen 20 of implantation chamber 16, where the first wafer undergoes an implantation process (low temp ion-implantation, for example) at block 314.

At block 316, wafer fabrication system 10 then transfers the first wafer to single wafer warming chamber 26 using robotic arm 30, where the first wafer is warmed to substantially room temperature, for example, at block 318. Although not illustrated, in one exemplary methodology, robotic arm 32 may transfer a second wafer from cooling chamber 22 to implantation chamber 16 while robotic arm 30 is transferring the first wafer to single wafer warming chamber (block 318). As will be discussed in more detail below, such simultaneous transference of wafers through wafer fabrication system 10 provides a high-throughput fabrication process. Nevertheless, at block 320, the first wafer is then transferred to load lock 14b. The foregoing process continues on any desired number of wafers until all are transferred to load lock 14b, and wafer fabrication system 10 then returns the pressure from vacuum to atmospheric at block 322 using robotic arm 30. Thereafter, wafer fabrication system 10 then transfers the wafers back to load ports 12 using robotic arm 28.

FIG. 4 illustrates a time lapse methodology 400 useful to further describe certain exemplary methodologies of the present invention. In this example, only four wafers will be described, although any number of wafers may be fabricated using method 400. Note that not every step in this exemplary method will be described here; rather, method 400 is intended to more clearly illustrate the time efficiency, and resulting high-throughput, provided by the present invention. The exemplary time slots (T1, T2, TN . . . ) described herein may be any desired length as dictated by system design or otherwise (for example, 30~500 seconds), as will be understood by those ordinarily skilled in the art having the benefit of this disclosure.

With reference to FIG. 4, at time T1, a first wafer (wafer 01) is transferred to implantation chamber 16. At time T2, the first wafer undergoes a low-temperature implantation process within implantation chamber 16. At time T3, the first wafer is then transferred to single wafer warming chamber 26 while a second wafer (wafer 02) is transferred to implantation chamber 16. At time T4, the first wafer is then warmed to the desired temperature inside single wafer warming chamber 26, while the second wafer undergoes low temperature implantation inside implantation chamber 16. At time T5, the first wafer is then transferred back to load lock 14a,14b, while the second wafer is transferred to single wafer warming chamber 26, and a third wafer (wafer 03) is transferred to implantation chamber 16. At time T6, the first wafer is now ready for further processing, while the second wafer is being warmed to the desired temperature inside single wafer warming chamber 26, and the third wafer undergoes low temperature implantation inside implantation chamber 16.

At time T7, the second wafer is then transferred to load lock 14a,14b where it is ready for further processing, while the third wafer is transferred to single wafer warming chamber 26, and a forth wafer (wafer 04) is transferred to implantation chamber 16. At time T8, the third wafer is then warmed up to the desired temperature inside single wafer warming chamber 26, while the fourth wafer undergoes low temperature implantation inside implantation chamber 16. At time T9, the third wafer is then transferred back to load lock 14a,14b, while the fourth wafer is then transferred to single wafer warming chamber 26. At time T10, the fourth wafer is then warmed to the desired temperature and then transferred back to load lock 14a,b at time T11. Accordingly, the wafers have been warmed from a low temperature to a desired temperature in a rapid, high-throughput fashion.

An exemplary methodology of the present invention provides a method for fabricating a semiconductor wafer comprising transferring a first semiconductor wafer to an implantation chamber and performing an implantation process on the first semiconductor wafer within the implantation chamber. After the implantation process on the first semiconductor wafer is complete, the first semiconductor wafer is transferred to the warming chamber while a second semiconductor wafer is simultaneously transferred to the implantation chamber. The first semiconductor wafer is then warmed within the warming chamber while the implementation process is simultaneously performed on the second semiconductor wafer. The first semiconductor wafer is then transferred out of the warming chamber for further processing while the second semiconductor wafer is simultaneously transferred to the warming chamber where it is warmed.

An exemplary embodiment of the present invention provides a system for fabricating a semiconductor wafer comprising an implantation chamber, a first and second robotic arm operably connected to the implantation chamber in order to transfer semiconductor wafers through the system, a pre-implantation cool down chamber positioned adjacent the implantation chamber, a load lock positioned adjacent the implantation chamber, and a warming chamber comprising one or more heating elements configured to warm the semiconductor wafers. In addition, the system comprises processing circuitry to implement any of the methods described herein.

In addition, an exemplary methodology of the present invention provides a method for fabricating a semiconductor wafer comprising implanting a first wafer inside an implantation chamber at time T1 and transferring the first wafer to a warming chamber at time T2. A second wafer is also transferred to the implementation chamber at time T2. At time T3, the first wafer is warmed inside the warming chamber and the second wafer is implanted inside the implantation chamber. At time T4, the first wafer is transferred out of the warming chamber for further processing and the second wafer is transferred to the warming chamber. At time T5, the second wafer is warmed inside the warming chamber.

The foregoing outlines features of several embodiments so that those ordinarily skilled in the art may better understand the aspects of the present disclosure. Those skilled persons should appreciate that they may readily use the present disclosure as a basis for designing or modifying other processes and structures for carrying out the same purposes and/or achieving the same advantages of the embodiments and methodologies introduced herein. For example, although a single wafer warming chamber is described herein, those ordinarily skilled persons would realize that a multiple wafer warming chamber may also be utilized. As such, those same skilled persons should also realize that such equivalent constructions do not depart from the spirit and scope of the present disclosure, and that they may make various changes, substitutions, and alterations herein without departing from the spirit and scope of the present disclosure. Therefore, it should be understood that the invention is not intended to be limited to the particular forms disclosed. Rather, the intention is to cover all modifications, equivalents, and alternatives falling within the spirit and scope of the invention as defined by the appended claims.

What is claimed is:

1. A method for fabricating a semiconductor wafer, the method comprising:
    transferring a first semiconductor wafer to an implantation chamber;
    performing an implantation process on the first semiconductor wafer within the implantation chamber;
    after performing the implantation process on the first semiconductor wafer, transferring the first semiconductor wafer to a single wafer warming chamber while simultaneously transferring a second semiconductor wafer to the implantation chamber;
    warming the first semiconductor wafer within the single wafer warming chamber, wherein the single wafer warming chamber is outside of the implantation chamber and has a sidewall shared with the implantation chamber; and
    after performing the warming of the first semiconductor wafer, transferring the first semiconductor wafer to a wafer cassette in a load lock.

2. The method of claim 1, further comprising:
performing the implantation process on the second semiconductor wafer while simultaneously warming the first semiconductor wafer within the single wafer warming chamber; and
warming the second semiconductor wafer within the single wafer warming chamber.

3. The method of claim 1, wherein the warming of the first semiconductor wafer comprises warming lower and upper surfaces of the first semiconductor wafer simultaneously with two heating elements.

4. The method of claim 1, wherein the warming of the first semiconductor wafer comprises warming the first semiconductor wafer to a temperature substantially equal to room temperature.

5. The method of claim 1, wherein the first semiconductor wafer is cooled to about −100° C. in a cooling chamber before the transferring of the first semiconductor wafer to the implantation chamber.

6. The method of claim 1, wherein the single wafer warming chamber is a vacuum environment.

7. The method of claim 1, wherein the single wafer warming chamber includes a wafer base having a first heating element built-in and a second heating element configured above the wafer base inside the single wafer warming chamber.

8. The method of claim 7, wherein the first and second heating elements include a lamp-type heater.

9. A method for fabricating a semiconductor wafer, the method comprising:
transferring a first wafer from an implantation chamber to a warming chamber by a first arm and a second wafer from a cooling chamber to the implantation chamber by a second arm simultaneously, wherein the warming chamber is a single wafer warming chamber adjacent to and outside of the implantation chamber, wherein the first arm is located in the implantation chamber and is configured to reach into the warming chamber for the transferring of the first wafer from the implantation chamber to the warming chamber;
performing a warming process to the first wafer in the warming chamber and an implantation process to the second wafer in the implantation chamber simultaneously;
transferring the first wafer to a load lock by the first arm immediately after completing the warming process; and
transferring the second wafer from the implantation chamber to the warming chamber by the first arm and a third wafer from the cooling chamber to the implantation chamber by the second arm simultaneously.

10. The method of claim 9, wherein the warming chamber includes a wafer base having a first heating element built-in and a second heating element configured above the wafer base inside the warming chamber.

11. The method of claim 10, wherein the performing of the warming process includes:
transferring the first wafer to the wafer base inside the warming chamber;
warming a back side of the first wafer using a built-in heating element inside the wafer base;
warming a front side of the first wafer using the second heating element; and
transferring the first wafer to the load lock.

12. The method of claim 11, wherein the first heating element and the second heating element include a lamp-type heater.

13. The method of claim 12, wherein the lamp-type heater is a halogen lamp.

14. The method of claim 9, wherein the warming chamber is a vacuum chamber.

15. A method for fabricating a semiconductor wafer, the method comprising:
transferring a first semiconductor wafer from an implantation chamber to a warming chamber and transferring a second semiconductor wafer from a cooling chamber to the implantation chamber simultaneously;
warming the first semiconductor wafer in the warming chamber and performing an implantation process to the second semiconductor wafer in the implantation chamber simultaneously, wherein the warming chamber is outside of the implantation chamber, wherein a sidewall of the warming chamber is part of a sidewall of the implantation chamber; and
transferring the first semiconductor wafer from the warming chamber to a load lock after the warming of the first semiconductor wafer.

16. The method of claim 15, wherein the transferring of the first semiconductor wafer from the warming chamber to the load lock comprises passing the first semiconductor wafer through the implantation chamber.

17. The method of claim 15, further comprising:
transferring the second semiconductor wafer from the implantation chamber to the warming chamber and transferring a third semiconductor wafer from the cooling chamber to the implantation chamber simultaneously; and
warming the second semiconductor wafer in the warming chamber.

18. The method of claim 15, wherein the transferring of the first semiconductor wafer from the implantation chamber to the warming chamber is performed by a first robotic arm that is located in the implantation chamber and is configured to reach into the warming chamber.

19. The method of claim 18, wherein the transferring of the second semiconductor wafer from the cooling chamber to the implantation chamber is performed by a second robotic arm.

20. The method of claim 15, wherein the warming chamber is a single wafer warming chamber.

21. The method of claim 15, wherein the warming of the first semiconductor wafer comprises warming lower and upper surfaces of the first semiconductor wafer simultaneously with two heating elements.

22. The method of claim 15, wherein the warming of the first semiconductor wafer comprises warming the first semiconductor wafer to a temperature substantially equal to room temperature.

23. The method of claim 15, wherein the second semiconductor wafer is cooled to about −100° C. in the cooling chamber before the transferring of the second semiconductor wafer from the cooling chamber to the implantation chamber.

* * * * *